United States Patent
Bean, Jr.

(10) Patent No.: US 8,033,122 B2
(45) Date of Patent: Oct. 11, 2011

(54) DEHUMIDIFIER APPARATUS AND METHOD

(75) Inventor: John H. Bean, Jr., Wentzville, MO (US)

(73) Assignee: American Power Conversion Corporation, West Kingston, RI (US)

( * ) Notice: Subject to any disclaimer, the term of this patent is extended or adjusted under 35 U.S.C. 154(b) by 725 days.

(21) Appl. No.: 12/041,919

(22) Filed: Mar. 4, 2008

(65) Prior Publication Data

US 2009/0223240 A1    Sep. 10, 2009

(51) Int. Cl.
 *F25D 17/06* (2006.01)
(52) U.S. Cl. ............................... 62/93; 62/90
(58) Field of Classification Search ............... 62/90, 93, 62/173, 176.5, 428; 165/228
See application file for complete search history.

(56) References Cited

U.S. PATENT DOCUMENTS

| | | | | |
|---|---|---|---|---|
| 2,200,118 A * | 5/1940 | Miller | | 62/173 |
| 3,585,811 A * | 6/1971 | Friedel | | 62/173 |
| 4,905,479 A * | 3/1990 | Wilkinson | | 62/271 |
| 5,309,725 A | 5/1994 | Cayce | | |
| 5,361,587 A * | 11/1994 | Hoffman | | 62/3.2 |
| 5,400,607 A * | 3/1995 | Cayce | | 62/90 |
| 5,493,871 A * | 2/1996 | Eiermann | | 62/173 |
| 5,632,333 A | 5/1997 | Imamura et al. | | |
| 5,799,728 A | 9/1998 | Blume | | |
| 6,658,874 B1 | 12/2003 | Trent | | |
| 6,694,757 B1 * | 2/2004 | Backman | | 62/173 |
| 6,967,283 B2 | 11/2005 | Rasmussen et al. | | |
| 7,155,318 B2 | 12/2006 | Sharma et al. | | |
| 7,197,433 B2 | 3/2007 | Patel et al. | | |
| 7,293,666 B2 | 11/2007 | Mattlin et al. | | |
| 2007/0101740 A1 * | 5/2007 | Akei et al. | | 62/238.7 |
| 2007/0101750 A1 * | 5/2007 | Pham et al. | | 62/332 |
| 2007/0163748 A1 | 7/2007 | Rasmussen et al. | | |
| 2007/0165377 A1 | 7/2007 | Rasmussen et al. | | |
| 2007/0167125 A1 | 7/2007 | Rasmussen et al. | | |

OTHER PUBLICATIONS

International Search Report for PCT/US2009/035134 mailed Jun. 10, 2009.

* cited by examiner

*Primary Examiner* — Frantz Jules
*Assistant Examiner* — Emmanuel Duke
(74) *Attorney, Agent, or Firm* — Lando & Anastasi, LLP

(57) ABSTRACT

A dehumidifier unit includes a first coil in fluid communication with a source of cooling fluid, a second coil in fluid communication with the source of cooling fluid, a third coil in fluid communication with the source of cooling fluid, and a thermal unit disposed between the source of cooling fluid and the second and third coils. The thermal unit may be adapted to remove heat from cooling fluid flowing to the second coil and adapted to heat cooling fluid flowing to the third coil. A fan may be configured to move air across the first, second and third coils. The first coil may be configured to pre-cool air moving over the first coil, the second coil may be configured to dehumidify the air moving over the second coil, and the third coil may be configured to warm the air moving over the third coil. Other embodiments and methods of cooling are further disclosed.

21 Claims, 5 Drawing Sheets

DEHUMIDIFIER APPARATUS AND METHOD

BACKGROUND OF THE INVENTION

1. Field of the Invention

The present disclosure relates to cooling systems, and more particularly to a dehumidifying apparatus configured to be operable to condition air within a data center, and related methods for cooling or treating air within a data center.

2. Discussion of Related Art

Equipment enclosures or racks for housing electronic equipment, such as data processing, networking and telecommunications equipment, have been used for many years. Such racks are used to contain and to arrange the equipment in small wiring closets as well as equipment rooms and large data centers. In certain embodiments, an equipment rack can be an open configuration and can be housed within a rack enclosure, although the enclosure may be included when referring to a rack. Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, in addition to a facility cooling system that is part of the data center's infrastructure, a data center may be further cooled by employing one or more computer room air conditioner ("CRAC") units that are typically hard piped, immobile units positioned around the periphery of the data center room. These CRAC units may intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

The rack-mounted equipment typically cools itself by drawing air along a front side or air inlet side of a rack, drawing the air through its components, and subsequently exhausting the air from a rear or vent side of the rack. A disadvantage of the CRAC-type of air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. Another disadvantage of employing CRAC-type units is that, while they are particularly suited to addressing sensible cooling, such units are not particularly suited to addressing latent cooling.

Another approach is by employing computer room air handler ("CRAH") units that are typically hard piped to a dedicated chiller plant. A trend emerging in the data center room cooling industry is the adoption of operating chiller plants with warmer supply set points, which increases the sensible heat ratio of conventional CRAH units and greatly reduces the moisture removal capacity of the unit. Traditionally, chilled water is delivered to air handlers at a temperature of 42° F. to 46° F. In an effort to promote more efficient chiller operation and higher sensible heat ratios, data center designers are presently setting chilled water supplies at higher water temperatures, e.g., water temperatures from 48° F. to 52° F.

SUMMARY OF THE INVENTION

One aspect of the disclosure is directed to a dehumidifier unit comprising a first coil in fluid communication with a source of cooling fluid, a second coil in fluid communication with the source of cooling fluid, a third coil in fluid communication with the source of cooling fluid, and a thermal unit disposed between the source of cooling fluid and the second and third coils. In one embodiment, the thermal unit is adapted to remove heat from cooling fluid flowing to the second coil and adapted to heat cooling fluid flowing to the third coil. A fan may be configured to move air across the first, second and third coils. In a certain embodiment, the first coil may be configured to pre-cool air moving over the first coil, the second coil may be configured to dehumidify the air moving over the second coil, and the third coil may be configured to warm the air moving over the third coil.

Embodiments of the dehumidifier unit may further include configuring the cooling fluid to flow from the source of cooling fluid with a portion of the cooling fluid flowing to the first coil and a portion of the cooling fluid flowing to the second coil and through the thermal unit. The cooling fluid may be configured to flow from one of the source of cooling fluid and the first coil to the third coil through the thermal unit. In one configuration, cooling fluid exhausted from the second coil may be configured to flow to the first coil. The thermal unit may reduce the temperature of the cooling fluid flowing to the second coil by approximately 15° F. The thermal unit may increase the temperature of the cooling fluid flowing to the third coil by approximately 25° F. A first valve may be positioned between the source of cooling fluid and the first coil with the first valve being configured to control the flow of cooling fluid to the first coil and the thermal unit. The cooling fluid exhausted from the first coil may be in fluid communication with the source of cooling fluid and the thermal unit. A second valve may be positioned between the thermal unit and the source of cooling fluid with the second valve being configured to control the flow of cooling fluid back to the source of cooling fluid.

Another aspect of the disclosure is directed to a method of dehumidifying a volume of space. The method comprises delivering cooling fluid from a source of cooling fluid to a first coil, delivering cooling fluid from the source of cooling fluid to a thermal unit, reducing the temperature of a portion of the cooling fluid when the cooling fluid flows through the thermal unit, delivering the reduced temperature cooling fluid from the thermal unit to a second coil, increasing the temperature a portion of the cooling fluid when the cooling fluid flows through the thermal unit, delivering the increased temperature cooling fluid from the thermal unit to a third coil, and moving air over the first, second and third coils.

Embodiments of the method may further include controlling the amount of cooling fluid delivered from the source of cooling fluid to the first coil and the thermal unit. The cooling fluid delivered from the thermal unit to the second coil may be approximately 15° F. colder than the cooling fluid delivered from the source of cooling fluid to the first coil. The cooling fluid delivered from the thermal unit to the third coil may be approximately 25° F. warmer than the cooling fluid delivered from the source of cooling fluid to the first coil.

Yet another aspect of the disclosure is directed to a method of dehumidifying a volume of space. The method comprises moving air over a first coil to pre-cool the air, moving air from the first coil over a second coil to dehumidify the air, and moving air from the second coil over a third coil to warm the air.

Embodiments of the method may further include delivering cooling fluid from a source of cooling fluid to the first coil. The method may further include delivering cooling fluid from the source of cooling fluid to a thermal unit, reducing the temperature of the cooling fluid as the cooling fluid flows through the thermal unit, and delivering the reduced temperature cooling fluid from the thermal unit to a second coil. The method may also include delivering cooling fluid from one of the source of the cooling fluid and the first coil to the thermal unit, increasing the temperature of the cooling fluid as the cooling fluid flows through the thermal unit, and delivering the increased temperature cooling fluid from the thermal unit to a third coil.

Another aspect of the disclosure is directed to dehumidifier unit comprising a housing, a first coil disposed within the housing, the first coil being in fluid communication with a source of cooling fluid and configured pre-heat air delivered by the air moving device, a second coil disposed within the housing, the second coil being in fluid communication with the source of cooling fluid and configured to dehumidify air, a third coil disposed within the housing, the third coil being in fluid communication with one of the source of cooling fluid and the first coil and configured to warm air delivered from the second coil; and an air moving device to move air over the first, second and third coils.

Embodiments of the dehumidifier unit may further comprise a thermal unit disposed between the source of cooling fluid and the second and third coils with the thermal unit being adapted to remove heat from cooling fluid flowing to the second coil and heat cooling fluid flowing to the third coil. The cooling fluid may be adapted to flow from the source of cooling fluid with a portion of the cooling fluid flowing to the first coil and a portion of the cooling fluid flowing to the second coil through the thermal unit. Fluid flowing from one of the source of cooling fluid and the first coil may be directed to the third coil through the thermal unit. The thermal unit may reduce the temperature of the cooling fluid flowing to the second coil by approximately 15° F. The thermal unit may increase the temperature of the cooling fluid flowing to the third coil by approximately 25° F. A first valve may be positioned between the source of cooling fluid and the first coil with the first valve being configured to control the flow of cooling fluid to the first coil. A second valve may be positioned between the first coil and the source of cooling fluid with the second valve being configured to control the flow of cooling fluid to the source of cooling fluid.

The present disclosure will be more fully understood after a review of the following figures, detailed description and claims.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
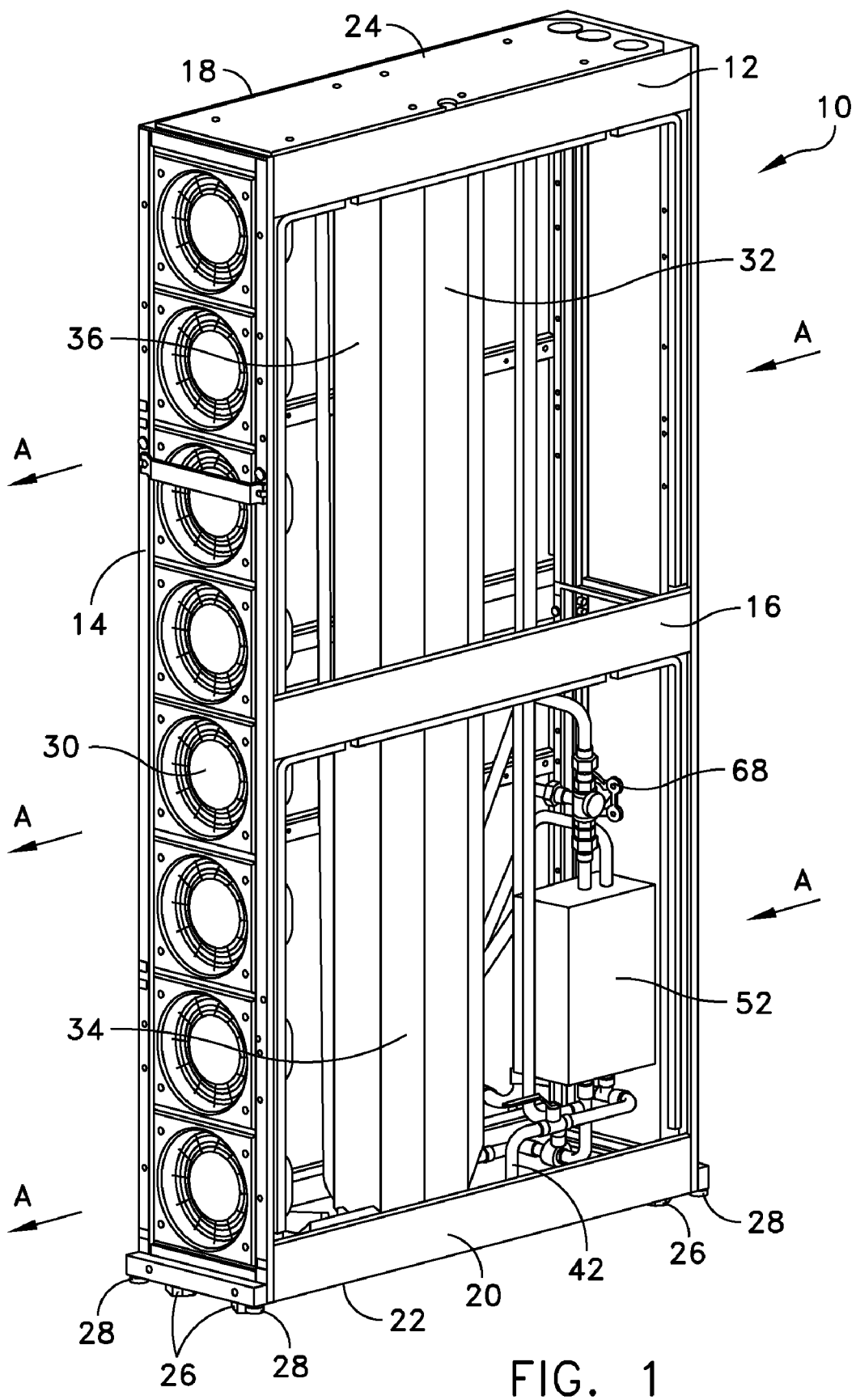
FIG. 1 is a perspective view of a dehumidifier apparatus of an embodiment of the disclosure.

This disclosure is not limited in its application to the details of construction and the arrangement of components set forth in the following description or illustrated in the drawings. The embodiments disclosed herein are capable of further embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

At least one embodiment of the present disclosure is directed to a modular and scalable cooling unit that is selectively configurable to cool electronic equipment housed within equipment enclosures or racks of a data center. As used herein, "enclosures" and "racks" are used to describe apparatus designed to support electronic equipment. Such a cooling system is capable of employing one or more cooling units on an as needed basis to provide localized cooling or air conditioning within the data center. Specifically, and by way of example only, multiple cooling units may be interspersed in a row of equipment racks to more efficiently cool the data center. In one embodiment, the cooling unit is particularly suited for removing humidity from the air of the data center. In another embodiment, the cooling unit is particularly suited to accommodate chiller plants having warmer supply set points, e.g., 52° F.

Data centers are typically large rooms designed, in certain instances, to house hundreds of electronic equipment racks arranged in rows within the data center. The rows of equipment racks may be arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling unit is modular and scalable, and may take the form of a kit designed to meet these changing needs. Also, although relatively large data centers are discussed as an intended use for such a cooling unit, as mentioned above, the unit of embodiments disclosed herein is scalable and may be employed in smaller rooms on a smaller scale.

In one embodiment, the cooling unit may be part of a cooling system, which comprises a plurality of cooling racks, with each cooling rack having a housing adapted to support components of the cooling system. Generally speaking, the cooling unit may be employed sporadically within the data center to address humidity within the data center. While the absolute moisture within the data center is relatively constant throughout the entire space, the cooling unit may be employed specifically in areas of the data center susceptible to higher humidity conditions if they occur. For example, and without limitation, the cooling unit may be disposed within a row of equipment racks and configured to intake the hot air within the data center from a hot aisle, for example, to remove moisture from the air within the hot aisle. This configuration decreases the latent cooling provided by the data center's air conditioning system thereby decreasing the need for humidification.

In certain embodiments, the cooling unit may be one-half the width of a standard size nineteen inch equipment rack, e.g., twelve inches in width, and may be modular so that the cooling unit may be inserted into a row of equipment racks in a matter of minutes by data center employees who have no particular heating and cooling training or specialization. The components of the cooling unit and the entire cooling system may be provided in kit form so that the person installing the cooling system does not require specialized tools. The modular nature of the cooling unit allows the user to optimize the location of each cooling unit since each cooling unit includes the ability to sense and display the capacity of the system, the flow rate, coolant and air inlet and outlet temperatures, and pressure differentials. Thus, the cooling unit, as part of an overall cooling system, may be employed and redeployed for maximum efficiency and use within the data center.

A typical data center may include a room defined by a floor, walls, and a ceiling. The data center may be designed to house a plurality of equipment racks. In one embodiment, each equipment rack may be constructed in accordance with the teachings disclosed in U.S. patent application Ser. No. 10/990,927, now U.S. Pat. No. 7,293,666, entitled EQUIPMENT ENCLOSURE KIT AND ASSEMBLY METHOD, filed on Nov. 17, 2004, which is owned by the assignee of the present disclosure and is incorporated herein by reference in its entirety for all purposes. Further, cabling between the equipment racks may be implemented using cable distribution troughs contained on the roofs of the racks as disclosed in U.S. Pat. No. 6,967,283, which is incorporated by reference in its entirety for all purposes and assigned to the assignee of the present disclosure.

Specifically, the equipment rack may include a frame or housing adapted to support electronic components, such as data processing, networking and telecommunications equipment. The housing may include a front, back, sides, bottom and top. The front of each equipment rack may include a front door so as to enable access into the interior of the equipment rack. A lock may be provided to prevent access into the interior of the equipment rack and the equipment housed by the rack. The sides of the equipment rack may include at least one panel to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack.

In one embodiment, the equipment racks are modular in construction and configured to be rolled into and out of position, e.g., within a row of the data center. Casters may be secured to the bottom of each equipment rack to enable the rack to roll along the floor of the data center. Once positioned, leveling feet may be deployed to securely ground the equipment rack in place within the row. An example of casters and leveling feet employed on such an equipment rack is disclosed in detail in U.S. Pat. No. 7,293,666.

Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof" as described in U.S. Pat. No. 6,967,283) at the top of the equipment rack having openings formed therein or through an open top of the equipment rack. In this embodiment, the cables may be strung along the roofs of the rack or be provided in the aforementioned cable distribution trough. In another embodiment, the cables may be disposed within a raised floor and connected to the electronic equipment through the bottom of the equipment rack. With both configurations, power and communication lines are provided to the equipment racks.

As discussed above, data centers are typically configured with rows of equipment racks arranged such that cool air is drawn into the racks from a cool aisle and warm or hot air is exhausted from the racks into a hot aisle. By way of example, the equipment racks may be arranged in two rows with the fronts of the equipment racks row being arranged in a forward direction and the backs of the equipment racks row being arranged in a rearward direction. However, as stated above, in a typical data center, there are multiple rows of equipment racks wherein the rows may be arranged with the fronts of the equipment racks facing one another to define the cold aisle and with the backs of the equipment racks facing one another to define the hot aisle.

In order to address the heat build-up and hot spots within the data center, and to address climate control issues within the data center in general, a modular cooling system is provided in one embodiment. In one embodiment, the cooling system may include a plurality of cooling racks disposed within the data center, which are designed to address sensible cooling, i.e., the dry bulb temperature cooling of the volume of space. An exemplary arrangement may include a cooling rack for every two equipment racks provided in the data center. However, it should be understood that a person of ordinary skill in the art, given the benefit of this disclosure, may provide more or less cooling racks within the data center depending on environmental conditions of the data center. Further in some embodiments, the concentration and locations of cooling racks may be adjusted based on the locations of the hottest racks in the data center, or based on information obtained and analyzed by a data center information management system.

Reference may be made to the cooling units disclosed in U.S. patent application Ser. Nos. 11/335,856, 11/335,874 and 11/335,901, each entitled COOLING SYSTEM AND METHOD and filed on Jan. 19, 2006, which are incorporated herein by reference in their entirety for all purposes. The cooling units disclosed therein are particularly suited to addressing sensible cooling requirements within the data center.

As mentioned above, many data centers are designed to provide elevated chilled water temperature to promote more efficient chiller plant operation and higher sensible heat ratios. During periods of high latent loads, cooling racks may be ineffective when it is required to remove moisture from the volume of space within the data center. Presently, data center designers and operators may provide oversized CRAH units or lower the chilled water temperature during periods of high latent loads.

In order to address latent cooling needs within a volume of space, such as a data center, dedicated dehumidifier units may be employed strategically throughout the space. Referring to FIG. 1, a dehumidifier unit, generally indicated at 10, includes a housing 12 that may be constructed similarly to the housing of a standard equipment rack or of a CRAC unit. For example, in one embodiment, the housing 12 may be a rectangular structure having a front 14, a back 16, two sides 18, 20, a bottom 22 and a top 24 defined by a frame constructed of vertical and horizontal support members. As will be disclosed in greater detail below, the housing 12 of the dehumidifier unit 10 is configured to accommodate equipment and may be configured to be conveniently broken down and disassembled for transport or storage.

As shown in FIG. 1, in one embodiment, the housing 12 of the dehumidifier unit 10 has a width that is approximately one-half the width of the equipment rack. As stated above, a typical nineteen inch rack has a width of approximately twenty-four inches. Thus, the width of the housing 12 of the dehumidifier unit 10 is approximately twelve inches. This sizing enables the person configuring the data center to position a dehumidifier unit or multiple dehumidifier units in between equipment racks while being able to maintain equivalent spacing of racks among several rows. The narrower width of the housing 12 also takes up less space, and, coupled with the modular and movable nature of the dehumidifier unit, enables the dehumidifier unit to be conveniently placed between two equipment racks in an easily scalable manner.

The front 14 of the housing 12 of the dehumidifier unit 10 may include a front panel (not shown) suitably secured to the frame. The front panel enables an operator of the data center to access the interior region of the dehumidifier unit 10. The dehumidifier unit 10 may include side panels (not shown) attachable to the frame of the housing 12 to cover the sides 18, 20 of the dehumidifier unit. However, since the dehumidifier unit 10 may be positioned between two equipment racks, the inclusion of side panels is not required. Similarly, the housing 12 may further include a back panel (not shown) to cover the back 16 of the dehumidifier unit 10. In one embodiment, the front, side and back panels may be suitably secured, e.g., by suitable screw fasteners, to the frame of the dehumidifier unit. In another embodiment, fasteners capable of manipulation by hand, e.g., thumbscrews or quarter-turn fasteners, may be employed to attach the panels to the frame. In certain embodiments, the front panel and/or the back panel may each embody a door, which is hingedly attached to the frame of the housing 12 of the dehumidifier unit 10.

In at least one embodiment, the dehumidifier unit 10 may be modular in construction and configured to be rolled into and out of position, e.g., within a row of the data center between two equipment racks. To enhance mobility, casters, each designated at 26, may be suitably secured to the bottom 22 of the housing 12 of the dehumidifier unit 10 to enable the dehumidifier unit to roll along the floor of the data center. Once positioned, leveling feet 28 may be deployed to securely ground the dehumidifier unit 10 in place within the row. As with the equipment rack, the casters 26 and leveling feet 28, and their attachment to the housing 12 of the dehumidifier unit 10, are disclosed in detail in U.S. Pat. No. 7,293,666. In another embodiment, the housing 12 of the dehumidifier unit 10 may be formed with an eye-bolt to enable a crane or some other lifting apparatus to raise and place the dehumidifier unit within the data center.

In one embodiment, the arrangement is such that the fronts of the equipment rack and the dehumidifier unit are adjacent the cold aisle and the backs of the rack and the unit are adjacent the hot aisle. The modular and movable nature of the dehumidifier unit 10 makes it particularly effective in removing moisture from locations within the data center requiring climate control, e.g., adjacent a hot aisle. This configuration enables the dehumidifier unit 10 to be used as a building block for data center cooling and climate control, as the data center operator adds and removes dehumidifier units (and/or cooling racks) on an as needed basis.

As shown, the front 14 of the housing 12 of the dehumidifier unit 10 has a number of variable speed fans (e.g., eight), each indicated at 30, that are adapted to draw filtered air from the back of the dehumidifier unit to the front of the dehumidifier unit as shown by arrows A. In one embodiment, the fans 30 may be assembled and wired within the housing 12 of the dehumidifier unit 10 such that a fan is removed by removing screws and sliding the fan out of a receptacle (not shown) formed in the housing of the dehumidifier unit. The electrical power provided to each fan may be connected and disconnected by a suitable connector, such as a blindmate connector. The arrangement is such that the fans are "hot swappable" based on their low voltage requirements as well as their easy removal from the receptacle and blindmate connector. In addition, a controller may be configured to monitor the operation of each fan so as to predict the failure of a fan based on power draw variances of the fan.

In a certain embodiment, each fan may be a direct current, axial fan of the type manufactured by ebm-pabst Inc. of Farmington, Conn. under model no. W1G250.

Further provided within the housing 12 of the dehumidifier unit 10 are a number of coils. In one embodiment, three coils, indicated at 32, 34 and 36, are provided, with each coil having a plurality of fins (not shown) to increase the surface area of the coil. Specifically, the coils 32, 34 and 36 may be positioned generally perpendicularly with respect to the direction of the air flowing through the housing 12 of the dehumidifier unit 10 (parallel to arrow A), with the coils being positioned at a slight angle with respect to a theoretical vertical plane that is parallel to the front and the back of the housing to enlarge the surface areas of the coil so as to accommodate a greater volume of hot air. The arrangement is such that the hot and/or moist air that is drawn through the back 16 of the dehumidifier unit 10 and is passed through the coils 32, 34, 36 to remove moisture from the hot air in the manner described below. As mentioned, the dehumidifier unit 10 may be positioned so that the back 16 of the dehumidifier unit is adjacent a hot aisle. Thus, the air drawn through the back 16 of the dehumidifier unit 10 is relatively hotter than ambient air within the data center. The fans 30 are configured to blow the conditioned air from the coils 32, 34, 36 to the front 14 of the dehumidifier unit 10.

In a certain embodiment, each coil may be of the type manufactured by Heatcraft, Inc. of Grenada, Miss. under model no. 3FZ1203D 12.00x24.00.

Figure 2:
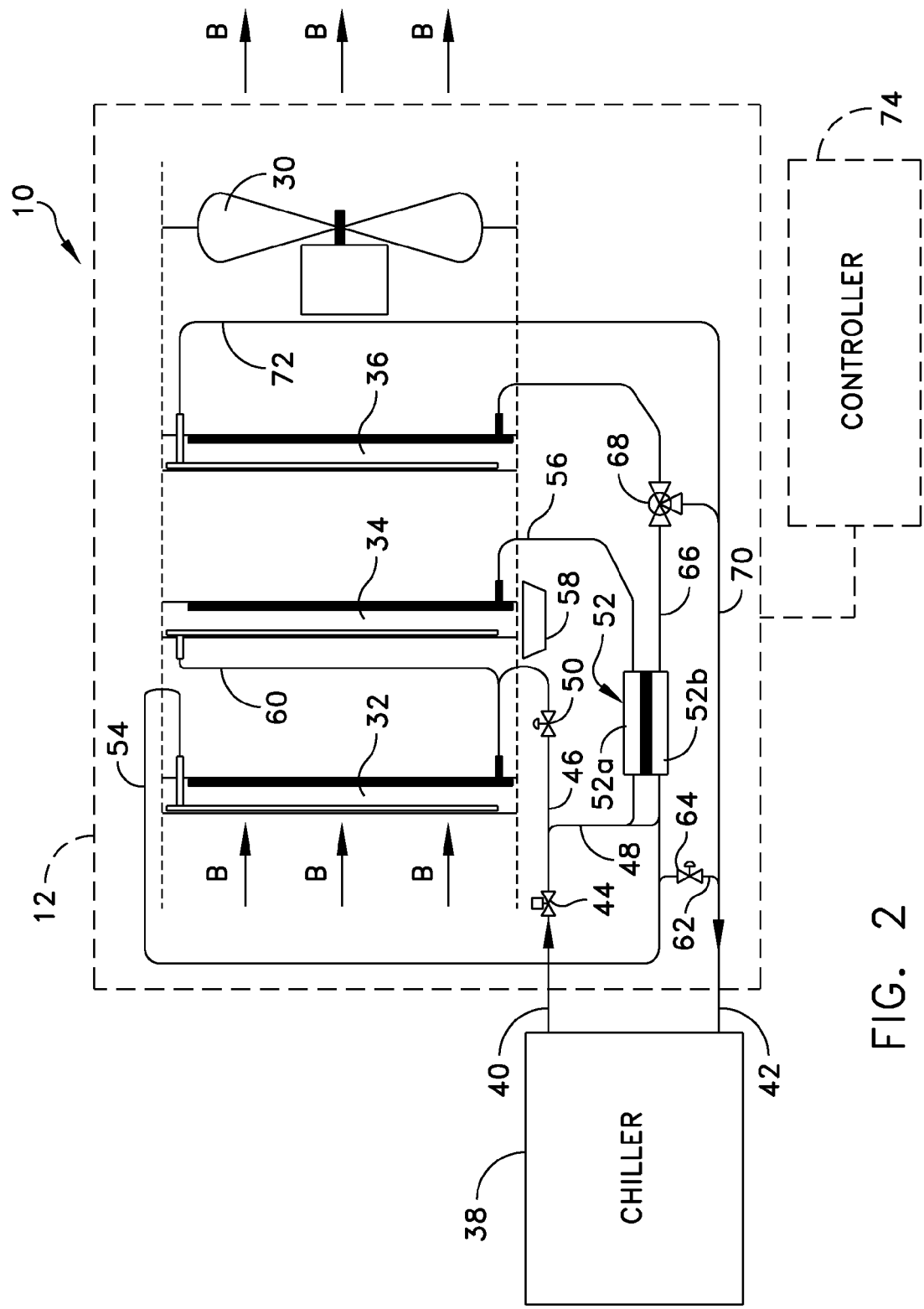
FIG. 2 is a schematic representation of an exemplary dehumidifier apparatus.

Referring now to FIG. 2, the dehumidifier unit 10 is connected to a source of cooling fluid, which is identified as a chiller 38 in FIG. 2, by lines 40, 42. As shown, line 40 provides chilled coolant, e.g., coolant at 52° F., from the chiller 38 to the housing 12 of the dehumidifier unit 10. Line 42 returns warmed coolant, e.g., 62° F., from the housing 12 of the dehumidifier unit 10 back to the chiller 38. The coolant may be any medium suitable for cooling applications, such as water, R134A coolant, and R410A coolant. In a certain embodiment, coolant is delivered to the dehumidifier unit 10 at a rate of 4.0 gallons per minute ("gpm") by line 40 and returned back to the chiller 38 at the same rate of 4.0 gpm by line 42.

As described, the dehumidifier unit 10 comprises three coils—a first pre-cooling coil 32, a second dehumidification coil 34 (sometimes referred to herein as a "super cooling" coil), and a third re-warming coil 36, as viewed from left-to-right in FIG. 2. The arrangement is such that the fans, which are schematically represented as one fan 30 in FIG. 2, draw air across the pre-cooling, dehumidification and re-warming coils 32, 34, 36 in succession in the direction indicated by arrows B. The arrangement is such that the moist air is drawn into the dehumidifier unit 10 and passes over the first coil 32 to pre-cool the air. Next, the pre-cooled air passes over the second coil 34 to super cool the air. This results in the condensation of any moisture in the air onto the second coil 34. The super cooled air then passes over the third coil 36 to re-warm the air. The warmed air exits the dehumidifier unit 10 through the back 16 of the unit into the volume of space.

Coolant entering into the dehumidifier unit 10 through line 40 first passes through a solenoid valve 44, and is then split between line 46 and line 48. Line 46 is in fluid communication with a mechanical regulating valve 50 prior to being delivered to the pre-cooling coil 32. Line 48 delivers coolant to a cold side 52a of a thermal electric cooling/heating unit 52, which is designed, in part, to cool the coolant to a specified temperature. In one embodiment, the thermal electric unit 52 may be set to cool the coolant entering into the unit from a temperature of 52° F. to a temperature of 37° F., which is 15° F. below the entering temperature of the coolant. The thermal electric unit 52 may be configured to cool the coolant to any desired temperature consistent with the teachings provided in this disclosure.

In a certain embodiment, the thermal electric cooling/heating unit may be a custom designed unit manufactured by BSST, LLC of Irwindale, Calif.

The mechanical regulating valve 50 may be manipulated to control the flow of coolant through lines 46 and 48. In a certain embodiment, mechanical regulating valve 50 may be controlled to enable coolant to flow through line 46 at a rate of 1.5 gpm and through line 48 at a rate of 2.5 gpm. As shown in FIG. 2, coolant flowing through line 46 from the mechanical regulating valve 50 enters the first pre-cooling coil 32. Coolant travels through the first coil 32 and exits the top of the first coil through line 54, which is connected at its other end to a hot side 52b of the thermal electric unit 52. As described above, the fan 30 (or other suitable air moving device) operates to move air over the first coil 32. The arrangement is such that air flowing over the first coil 32 heats the coolant traveling within the coil to a temperature of about 56° F. Line 54 delivers the coolant to the thermal electric unit 52. The conditioning of the coolant delivered by line 54 by the thermal electric unit 52 shall be described in greater detail below.

The coolant traveling in line 48 through the thermal electric unit 52 and cooled to a predetermined temperature, e.g., 37° F., is delivered to the second dehumidification coil 34 by line 56 at a rate of 2.5 gpm. The coolant travels through the second coil 34 and is heated by the pre-cooled air traveling through the dehumidifier unit 10 from the first coil 32. In one embodiment, the coolant is heated to a temperature of about 47° F. Accordingly, as described above, the pre-cooled air flowing from the first coil 32 through the second coil 34 is cooled to a temperature sufficient to condense any moisture contained within the air on the second coil. The dehumidifier unit 10 may be configured with a condensate pan 58 to collect water generated from the second coil 34. Although shown in FIG. 2 to be positioned below the second coil 34, the condensate pan 58 may be configured to extend underneath all three coils 32, 34, 36.

Once through the second coil 34, coolant is delivered by line 60 to the first coil 32. As shown in FIG. 2, the line 60 merges with line 46, which extends from the mechanical regulating valve 50. The amount of fluid traveling through the first coil 32 is 4.0 gpm, which results from 1.5 gpm from line 46 and 2.5 gpm from line 60. Thus, the rate of fluid exiting the first pre-cooling coil 32 (4.0 gpm) is the same rate as fluid entering the dehumidifier unit 10 (4.0 gpm).

As discussed, coolant traveling through lines 46, 56 travels to the first and second coils 32, 34, respectively. Once discharged from the first coil 32, coolant flows back to the hot side 52b of the thermal electric unit 52 through line 54. Prior to reaching the thermal electric unit 52, coolant may flow through line 62. The flow rate of coolant through the line 62 is controlled by a mechanical regulating valve 64. Coolant discharged from the hot side 52b of the thermal electric unit 52 flows through line 66. In one embodiment, the coolant flows at a rate of 2.3 gpm through line 66 and 1.7 gpm through line 62. As described, in a certain embodiment, the coolant is at a temperature of about 56° F. when it enters the thermal electric unit 52, which is configured to utilize the heat removed from the cool side of the unit to heat the coolant to a temperature of 80° F., which is approximately 25° F. higher than the coolant entering the thermal electric unit. As with the cold side 52a of the thermal electric unit 52, the hot side 52b may be configured to heat the coolant to any desired temperature consistent with the teachings provided in this disclosure.

The coolant travels from the thermal electric unit 52 through line 66 to a control valve 68, which modulates the flow of coolant through the line. Although a second line 70 is shown to extend from the control valve 68, in one embodiment, no coolant flows through the second line during operation of the dehumidifier unit 10. As described above, in a certain embodiment, coolant flows through line 66 at a rate of 2.3 gpm. This line 66 is connected to the third re-warming coil 36. The warm coolant traveling through the third coil 36, e.g., coolant at 80° F., enables the third coil 36 to warm the cool air flowing from the second coil 34 through the third coil prior to discharging the air from the dehumidifier unit 10. In one embodiment, the coolant is cooled through the third re-warming coil 36 to a temperature of about 66.5° F. This coolant is delivered to line 72, which is connected to the chiller 38 by line 70.

As discussed in greater detail below, a controller 74 may be provided to control the operation of the dehumidifier unit.

By way of example only, in one embodiment, the dehumidifier unit 10 may be configured to remove 21.6 grains moisture per pound of air circulated, assuming an inlet condition of 75° F. dry-bulb and 63.6° F. wet-bulb (70 grains moisture per pound) with a source chilled water temperature of 52° F. Delivery of the conditioned air back to into the volume of space is preferably reasonably close to the desired temperature of the volume of space. Stated another way, for a more efficient cooling operation, the air re-entering the volume of space should not be overcooled. Conventional CRAH units have limited if nonexistent moisture removal capability when presented with the same conditions.

With the foregoing example, the dehumidifier unit 10 provides a sensible heat ratio of about 18 percent. Stated another way, 82 percent of the enthalpy taken from the air is latent, leaving minimal impact on the dry-bulb temperature. Furthermore, the dehumidifier unit 10 provides a latent coefficient of performance of approximately 99.5 percent. The latent energy removed from the air, e.g., vapor removed as condensate, is about equal to the primary energy consumption of the dehumidifier unit 10. By comparison, a traditional dehumidifier units using vapor compression cycle would need to allow space condition to reach 95° F. dry-bulb and 82.7° F. wet-bulb (151 grains moisture per pound) to achieve similar moisture removal and power consumption, which is unacceptable for data centers.

Figure 3:
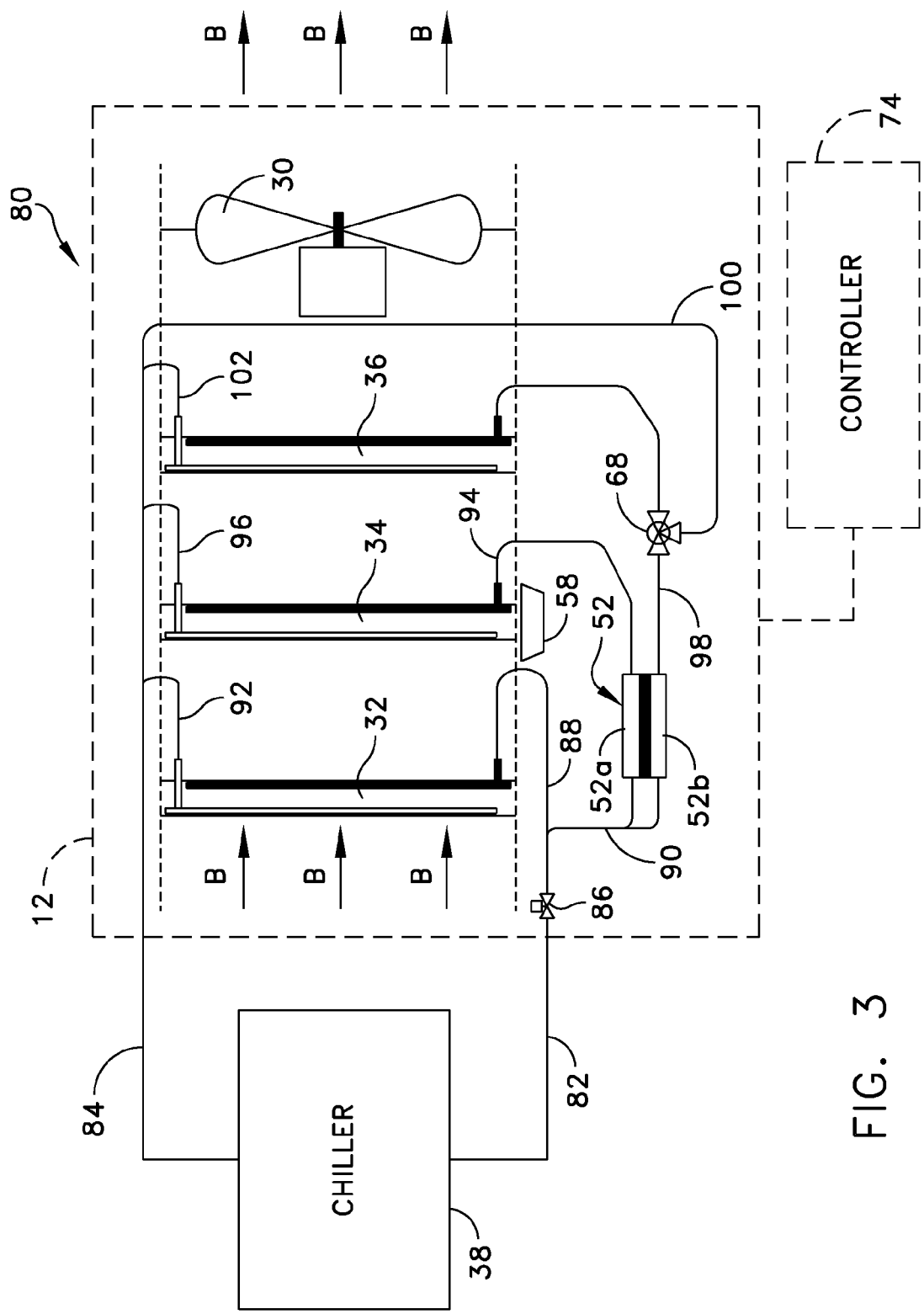
FIG. 3 is a schematic representation of a dehumidifier apparatus of another embodiment of the disclosure.

FIG. 3 represents another embodiment of the dehumidifier unit, generally indicated at 80, which is similar to dehumidifier unit 10, with each identical or nearly identical component being referenced by like numerals. As shown, the dehumidifier unit 80 is connected to the chiller 38 by lines 82, 84. As shown, line 82 provides chilled coolant, e.g., coolant at 52° F., from the chiller 38 to the housing 12 of the dehumidifier unit 80. Line 84 returns warmed coolant, e.g., about 57° F., from the housing 12 of the dehumidifier unit 10 back to the chiller 38. In a certain embodiment, coolant is delivered to the dehumidifier unit 80 at a rate of 8.4 gallons per minute ("gpm") by line 82 and returned back to the chiller 38 at the same rate of 8.4 gpm by line 84.

As with dehumidifier unit 10, the dehumidifier unit 80 comprises three coils—the first pre-cooling coil 32, the second dehumidification coil 34, and the third re-warming coil 36, as viewed from left-to-right in FIG. 3. Coolant entering into the dehumidifier unit 80 through line 82 first passes through a solenoid valve 86, and is then split between line 88 and line 90. Line 88 is in fluid communication with the pre-cooling coil 32. Line 90 delivers coolant to the thermal electric unit 52. As with dehumidifier unit 10, the thermal electric unit 52 of the dehumidifier unit 80 may be set to cool the coolant entering into the unit from a temperature of 52° F. to a temperature of 37° F., which is 15° F. below the entering temperature of the coolant.

In a certain embodiment, coolant flows through line 88 at a rate of 4.0 gpm and through line 90 at a rate of 4.4 gpm. As shown in FIG. 3, coolant travels through the first coil 32 and exits the top of the first coil via line 92, which is connected to the chiller 38 by line 84. As described above, the fan 30 operates to move air over the first coil 32. The arrangement is such that air flowing over the first coil 32 heats the coolant traveling within the coil to a temperature of about 58° F.

Still referring to FIG. 3, the coolant traveling in line 90 through the thermal electric unit 52 and cooled by the cold side 52a of the thermal electric unit 52 to a predetermined temperature, e.g., 37° F., is delivered to the second dehumidification coil 34 by line 94 at a rate of 2.5 gpm. The coolant travels through the second coil 34 and is heated by the air traveling through the dehumidifier unit 80 from the first coil 32. In one embodiment, the coolant is heated to a temperature of about 47° F. Accordingly, the pre-cooled air flowing from the first coil 32 through the second coil 34 is cooled to condense any moisture contained within the air on the second coil. As with dehumidifier unit 10, the dehumidifier unit 80 may be configured with a condensate pan 58 to collect water generated from the second coil 34. Although shown in FIG. 3 to be positioned below the second coil 34, the condensate pan 58 may be configured to extend underneath all three coils 32, 34, 36. Once through the second coil 34, coolant is delivered by line 96 to the chiller 38 via line 84.

As set forth above, in one embodiment, coolant flows from the cold side 52a of the thermal electric unit 52 at a rate of 2.5 gpm. The remaining coolant travels to the hot side 52b of the thermal electric unit 52 at a rate of 1.94 gpm. As described, in a certain embodiment, the coolant, prior to entering the thermal electric unit 52, is at a temperature of about 56° F., which is configured to utilize the heat removed from the cool side of the unit to heat the coolant to a temperature of 79° F. As with the cold side 52a of the thermal electric unit 52, the hot side 52b of the thermal electric unit may be configured to heat the coolant to any desired temperature consistent with the teachings provided in this disclosure.

The coolant travels from the hot side 52b of the thermal electric unit 52 through line 98 to the control valve 68, which modulates the flow of coolant through the line. Although a second line 100 is shown to extend from the control valve 68, in one embodiment, no coolant flows through the second line during operation of the dehumidifier unit 80. As described above, in a certain embodiment, coolant flows through line 98 at a rate of 1.94 gpm. This line 98 is connected to the third re-warming coil 36. The warm coolant traveling through the third coil 36, e.g., coolant at 79° F., enables the third coil to warm the cold air flowing from the second coil 34 through the third coil prior to discharging the air from the dehumidifier unit 80. In one embodiment, the coolant is cooled through the third re-warming coil 36 to a temperature of about 66° F. This coolant is delivered to line 102, which is connected to the chiller 38 via line 84. The controller 74 may be provided to control the operation of the dehumidifier unit 80 in the manner described below.

Figure 4:
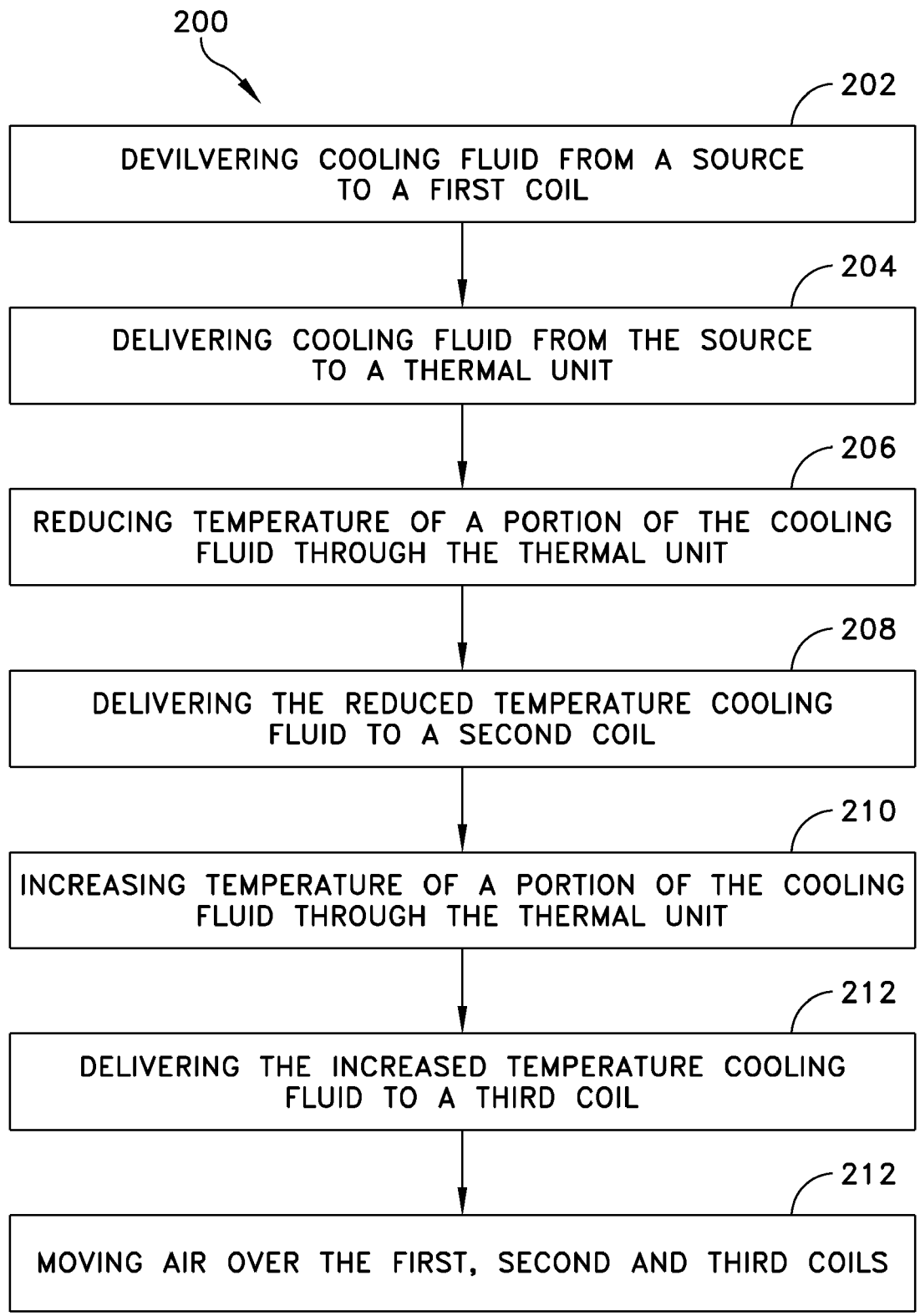
FIG. 4 is a functional block diagram of a method of an embodiment of the disclosure.
Figure 5:
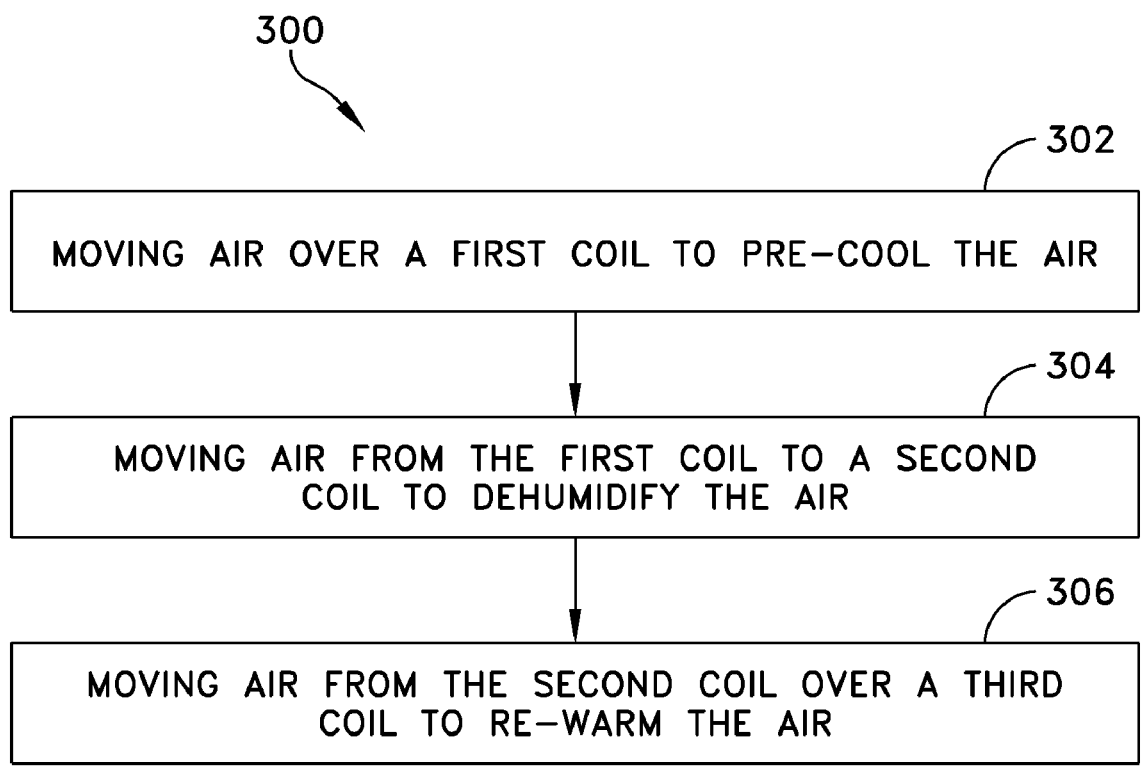
FIG. 5 is a functional block diagram of another method of an embodiment of the disclosure.

Referring now to FIGS. 4 and 5, and more particularly to FIG. 4, methods of dehumidifying a volume of space are further disclosed herein. As shown in FIG. 4, in one embodiment, a method 200 comprises: (a) delivering cooling fluid from a source of cooling fluid to a first coil at 202; (b) delivering cooling fluid from the source of cooling fluid to a thermal unit at 204; (c) reducing the temperature of a portion of the cooling fluid when the cooling fluid flows through the thermal unit at 206; (d) delivering the reduced temperature cooling fluid from the thermal unit to a second coil at 208; (e) increasing the temperature of a portion of the cooling fluid when the cooling fluid flows through the thermal unit at 210; (f) delivering the increased temperature cooling fluid from the thermal unit to a third coil at 212; and (g) moving air over the first, second and third coils at 214. In certain embodiments, the method further includes controlling the amount of cooling fluid delivered from the source of cooling fluid to the first coil and to the thermal unit. Embodiments of the method may be performed by the dehumidifier units 10 and 80.

Turning to FIG. 5, another method 300 comprises: (a) moving air over a first coil to pre-cool the air at 302; (b) moving air from the first coil over a second coil to dehumidify the air at 304; and (c) moving air from the second coil over a third coil to re-warm the air at 304. Embodiments of the method may be performed by the dehumidifier units 10 and 80.

In one embodiment, the lines connecting the chiller to the dehumidifier units may embody flexible tubing, which is connected to the dehumidifier units by suitable couplings. In a certain embodiment, depending on the configuration of the controller and the network manager system, a flow meter may be provided to be operably coupled to the controller to measure the flow of coolant through the flexible tubing. The dehumidifier units of embodiments of the disclosure may utilize the flow meter to provide the flow rate of the coolant to the controller. In a further embodiment, the flow meter enables the controller to calculate the capacity of the operation of the dehumidifier unit based on information obtained by the controller.

In certain embodiments, the controller may be provided to control the operation of the cooling system in general and the dehumidifier unit in particular based on environmental parameters obtained by the controller. In a particular embodiment, the controller may embody controller units provided in the cooling racks and/or dehumidifier units that communicate with one another over a controller area network (CAN) Bus. In other embodiments, a master controller may be provided to control the operation of the controller units. Specifically, each cooling rack and/or dehumidifier unit may be provided with a display assembly operably coupled to the controller. The display assembly may be adapted to display the environmental conditions of the data room, such as, and not limited to, the temperature and the humidity of the data center at the cooling rack and/or dehumidifier unit, the temperature of the air entering into and exiting out of the cooling rack and/or dehumidifier unit, the temperature of coolant entering into and exiting out of the cooling rack and/or unit, the flow rate of coolant entering the cooling rack and/or dehumidifier unit, and the cooling capacity of the cooling rack and/or dehumidifier unit. Suitable monitors and/or gauges may be provided to acquire such information. Alternatively, or in addition to the foregoing embodiment, the environmental conditions may be displayed on a unit provided with an integrated data center control and monitoring system.

Changes to the environmental conditions, such as the temperature of the data center, results in changes of inputs including the temperature of the coolant flowing into and out of each cooling rack and/or dehumidifier unit. Further inputs provided to the controller include the flow rate of coolant entering into the cooling rack and/or dehumidifier unit through the flow meter, as well as the known values of the coolant (e.g., water). Based on the temperature of the coolant, the flow rate of the coolant, the total heat transfer may be determined, which may be calculated by multiplying the flow rate by the coolant density, by the specific heat of the coolant, and by the difference between the coolant outlet and inlet temperatures. This heat transfer calculation may be determined by the controller so that the amount of coolant delivered to a cooling rack and/or dehumidifier unit through the flow meter of the cooling rack may be calculated. The controller may be further configured to allow for user input for calculating load capacity of each cooling rack and/or dehumidifier unit in real time. The value obtained may be compared to the maximum possible cooling capacity to assess the reserve cooling capacity of the cooling system.

In a certain embodiment, the display assembly includes a display unit having a liquid crystal display, for example, to display the environmental conditions, such as temperature and humidity of the data center, the temperature of air entering into and exiting out of each cooling rack and/or unit, the temperature of coolant entering into and exiting out of each cooling rack and/or unit, and the flow rate of coolant entering such cooling rack and/or unit. A plurality of control buttons and status indicators are further provided on the display unit to enable the operator to manipulate the operation of the cooling system. The display assembly may be secured within an opening formed in the front panel of the cooling rack by means of a sealing gasket and a mounting bracket in which screw fasteners (not shown) may be provided to secure the display assembly to the front panel within the opening.

As described above, each equipment rack is capable of generating a tremendous amount of heat. Sometimes, in certain embodiments, it may be desirable to provide a dehumidifier unit that is dedicated to removing the humidity generated by a particular equipment rack. For example, the cooling system may include front and back plenums, which are adapted to be attached to the fronts and the backs of the equipment and dehumidifier units. The arrangement is such that the equipment rack and the dehumidifier unit are arranged in side-by-side relation after removing the front and back doors of the equipment rack and the front and back panels (or doors) of the dehumidifier unit. The arrangement is such that the plenums capture air within the equipment rack and the dehumidifier unit to create an isolated environment between the equipment rack and the cooling rack so that heated air flows directly from the back of the equipment rack to the back of the cooling rack through the back plenum. The dehumidifier unit of embodiments of the invention may be part of a cooling system having cooling racks, which are provided to address the sensible cooling requirements. The plenums may be part of a modular system designed to work in conjunction with an equipment rack and a cooling rack and/or dehumidifier unit to provide maximum cooling predictability, capacity and efficiency.

As shown and described, the dehumidifier unit of embodiments of the present disclosure is modular and scalable so that a person designing a cooling system for the data center may select the dehumidifier unit as part of the overall system incorporating many individual components. Specifically, depending on the electronic equipment deployed within the data center, and the optimum operating conditions required for the equipment, the person may design a cooling system that is optimized and tailored to the particular data center.

As referenced above, in one embodiment, the controller may be a separately dedicated unit that controls the operation of the dehumidifier unit. In another embodiment, the controller may be provided in one of the cooling racks and/or dehumidifier units in place of one of the controller units, with the cooling rack and/or dehumidifier unit having the controller functioning as the main cooling rack and the other cooling racks and/or dehumidifier units functioning as subservient cooling racks. In yet another embodiment, the operation of the cooling system may be operated under the control of an integrated data center control and monitoring system with each cooling rack having a controller unit that communicates with the other cooling racks over the network. In one such embodiment, the controller may communicate with a data center control system to provide status of the components of the cooling system and to receive control commands for the data center control system. In one embodiment, each dehumidifier unit may include a controller that communicates with the data center controller over a network, such as a CAN Bus network, and in one such embodiment, the data center controller may be implemented using the integrated data center control and monitoring system, such as the InfraStruXure™ data center manager sold by American Power Conversion Corporation of West Kingston, R.I., the assignee of the present invention.

Thus, it should be observed that the dehumidifier unit of the present disclosure is particularly configured for scalable and modular implementation within a data center. The dehumidifier unit may be provided as part of a kit that may be installed by personnel having no particular training in cooling system installation and no specialized tools. One benefit of the cooling system is that cooling racks and/or units may be movable within a data center, or to another data center, when environmental conditions or needs within the data center change.

In addition, since the dehumidifier unit of embodiments disclosed herein may be provided as an in-row product, the dehumidifier unit may be positioned to intake the most humid air in the data center and to treat it to reduce moisture in the air. The improvements to efficiency may best be seen by the fact that the foot print of a dehumidifier unit may be decreased. To assist the operator in optimizing the locations of the dehumidifier units, the cooling capacity of each unit may be monitored by the operator, along with the flow rate, water and air inlet and outlet temperatures, and pressure differentials. These readings enable the operator to strategically place the dehumidifier units in positions where each dehumidifier unit may neutralize the maximum amount of humidity, while providing higher flexibility to the operator in the room design and layout and removing the constraint of having air conditioners positioned around the periphery of the data center. From a power perspective, each dehumidifier unit may operate under direct current, thus providing some level of flexibility to the input power provided. Thus, a dehumidifier unit no longer needs to be built for a specific voltage.

As described above, the cooling system of embodiments of the invention may be further provided as part of an integrated data center control and monitoring system. When used with such an integrated control and monitoring system, the cooling system of the present disclosure enables easy removal of a dehumidifier unit or units for service and relocation to another position within the data center. The cooling system may also be integrated into an existing cooling system of the building housing the data center, for example and used in conjunction with one or more CRAC and/or CRAH units to provide additional cooled air where needed in the data center.

The cooling system may be provided with a predictive failure determination module by utilizing a number of factors. Specifically, through the controller, each dehumidifier unit may be designed to notify the data center operator when certain parts, such as motors, fans, or any other part subject to wear, are near the ends of their useful life. The provision of such a module will enable a reasonably timed preventative maintenance action to be performed and to save possible downtime. The notification may be delivered to the display of the rack, or provided to the operator of the data center through the integrated control and monitoring system. In addition, a controller of the cooling system configured as a main controller may compensate for a failure of a particular dehumidifier unit by increasing the output of other cooling units positioned near the failed dehumidifier unit.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A dehumidifier unit comprising:
   a first coil in fluid communication with a source of chilled water;
   a second coil in fluid communication with the source of chilled water;
   a third coil in fluid communication with the source of chilled water;
   a thermal unit disposed between the source of chilled water and the second and third coils, the thermal unit being adapted to remove heat from the chilled water flowing to the second coil and adapted to heat the chilled water flowing to the third coil; and
   a fan configured to move air across the first, second and third coils, wherein the first coil is configured to pre-cool air moving over the first coil, the second coil is configured to dehumidify the air moving over the second coil, and the third coil is configured to warm the air moving over the third coil.

2. The dehumidifier unit of claim 1, wherein the chilled water is configured to flow from the source of chilled water with a portion of the chilled water flowing to the first coil and a portion of the chilled water flowing to the second coil and through the thermal unit.

3. The dehumidifier unit of claim 2, wherein the chilled water is configured to flow from one of the source of chilled water and the first coil to the third coil through the thermal unit.

4. The dehumidifier unit of claim 3, wherein chilled water exhausted from the second coil is configured to flow to the first coil.

5. The dehumidifier unit of claim 1, wherein the thermal unit reduces the temperature of the chilled water flowing to the second coil by approximately 15° F.

6. The dehumidifier unit of claim 5, wherein the thermal unit increases the temperature of the chilled water flowing to the third coil by approximately 25° F.

7. The dehumidifier unit of claim 1, further comprising a first valve positioned between the source of chilled water and the first coil, the first valve being configured to control the flow of chilled water to the first coil and the thermal unit.

8. The dehumidifier unit of claim 7, wherein chilled water exhausted from the first coil is in fluid communication with the source of chilled water and the thermal unit.

9. The dehumidifier unit of claim 8, further comprising a second valve positioned between the thermal unit and the source of chilled water, the second valve being configured to control the flow of chilled water back to the source of chilled water.

10. A method of dehumidifying a volume of space, the method comprising:
    delivering chilled water from a source of chilled water to a first coil;
    delivering chilled water from the source of chilled water to a thermal unit;
    reducing the temperature of a portion of the chilled water when the chilled water flows through the thermal unit;
    delivering the reduced temperature chilled water from the thermal unit to a second coil;
    increasing the temperature of a portion of the chilled water when the chilled water flows through the thermal unit;
    delivering the increased temperature chilled water from the thermal unit to a third coil; and
    moving air over the first, second and third coils.

11. The method of claim 10, further comprising controlling the amount of chilled water delivered from the source of chilled water to the first coil and the thermal unit.

12. The method of claim 10, wherein the chilled water delivered from the thermal unit to the second coil is approximately 15° F. colder than the chilled water delivered from the source of chilled water to the first coil.

13. The method of claim 12, wherein the chilled water delivered from the thermal unit to the third coil is approximately 25° F. warmer than the chilled water delivered from the source of chilled water to the first coil.

14. A method of dehumidifying a volume of space, the method comprising:
    moving air over a first coil to pre-cool the air;
    moving air from the first coil over a second coil to dehumidify the air;
    moving air from the second coil over a third coil to warm the air;
    delivering chilled water from a source of chilled water to the first coil;
    delivering chilled water from the source of chilled water to a thermal unit, reducing the temperature of the chilled water as the chilled water flows through the thermal unit, and delivering the reduced temperature chilled water from the thermal unit to a second coil; and delivering chilled water from one of the source of the chilled water and the first coil to the thermal unit, increasing the temperature of the chilled water as the chilled water flows through the thermal unit, and delivering the increased temperature chilled water from the thermal unit to a third coil.

15. A dehumidifier unit comprising:

a housing;

a first coil disposed within the housing, the first coil being in fluid communication with a source of chilled water and configured to pre-heat air;

a second coil disposed within the housing, the second coil being in fluid communication with the source of chilled water and configured to dehumidify air;

a third coil disposed within the housing, the third coil being in fluid communication with one of the source of the chilled water and the first coil and configured to warm air delivered from the second coil;

an air moving device to move air over the first, second and third coils; and a thermal unit disposed between the source of chilled water and the second and third coils, the thermal unit being adapted to remove heat from chilled water flowing to the second coil and heat chilled water flowing to the third coil.

16. The dehumidifier of claim 15, wherein the chilled water is adapted to flow from the source of chilled water with a portion of the chilled water flowing to the first coil and a portion of the chilled water flowing to the second coil through the thermal unit.

17. The dehumidifier of claim 16, wherein fluid flowing from one of the source of chilled water and the first coil is directed to the third coil through the thermal unit.

18. The dehumidifier of claim 15, wherein the thermal unit reduces the temperature of the chilled water flowing to the second coil by approximately 15° F.

19. The dehumidifier of claim 18, wherein the thermal unit increases the temperature of the chilled water flowing to the third coil by approximately 25° F.

20. The dehumidifier of claim 15, further comprising a first valve positioned between the source of chilled water and the first coil, the first valve being configured to control the flow of the chilled water to the first coil.

21. The dehumidifier of claim 20, further comprising a second valve positioned between the first coil and the source of chilled water, the second valve being configured to control the flow of the chilled water to the source of chilled water.

* * * * *